United States Patent [19]

Davey et al.

[11] Patent Number: 4,996,171

[45] Date of Patent: Feb. 26, 1991

[54] SILVER-FILLED GLASS

[75] Inventors: Nigel M. Davey, Wargrave; Gordon G. Ferrier, Reading, both of United Kingdom

[73] Assignee: Johnson Matthey Public Limited Company, London, England

[21] Appl. No.: 288,640

[22] Filed: Dec. 22, 1988

[30] Foreign Application Priority Data

Dec. 24, 1987 [GB] United Kingdom ................ 8730196

[51] Int. Cl.$^5$ ................................................ C03C 8/18
[52] U.S. Cl. ........................................ 501/19; 501/20; 501/46; 106/1.14
[58] Field of Search .................... 106/1.14; 501/46, 19, 501/20

[56] References Cited

U.S. PATENT DOCUMENTS

| | | | |
|---|---|---|---|
| 3,497,774 | 2/1970 | Hornberger et al. | 317/101 |
| 4,401,767 | 8/1983 | Dietz et al. | 501/19 |
| 4,436,785 | 3/1984 | Dietz et al. | 428/427 |
| 4,459,166 | 7/1984 | Dietz et al. | 156/89 |
| 4,636,254 | 1/1987 | Husson, Jr. et al. | 106/1.14 |
| 4,743,302 | 5/1988 | Dumesnil et al. | 501/44 |
| 4,761,224 | 8/1988 | Husson, Jr. et al. | 106/1.14 |

*Primary Examiner*—William R. Dixon, Jr.
*Assistant Examiner*—Deborah Jones
*Attorney, Agent, or Firm*—Cushman, Darby & Cushman

[57] ABSTRACT

Silver-filled glass pastes useful for the attachment of silicon semi-conductor devices (dies) to substrates comprise particulate silver and a lead phosphate glass, together with conventional organic components. The pastes have low bonding temperatures, and give good adhesion at firing temperatures of 350° to 460° C.

5 Claims, No Drawings

SILVER-FILLED GLASS

This invention relates to silver-filled glass metallising pastes for use in attachment of silicon semi-conductor devices ("dies") to frames or packages. In particular it relates to improved die-attach pastes based on selected phosphate glasses, such glasses having transition temperatures often lower than those of the borate glasses at present used in die-attach pastes.

For many years the semi-conductor industry's standard method of die attachment was by gold silicon eutectic bonding. Use of this method for large area dies was not satisfactory due to die stresses and this problem has been overcome by the introduction of silver-glass die-attach pastes. Reference is made to GB Patent No. 1,181,621 (Beckman Instruments), U.S. Pat. Nos. 4,436,785 and 4,459,166 (Dietz/Johnson Matthey Inc) and U.S. Pat. Nos. 4,636,254 and 4,761,224 (Husson); the teaching of which patents is incorporated herein.

These pastes have been commercially produced and consist of silver flake and lead borate glass in fine particulate form dispersed in a fugitive organic vehicle usually consisting of a thermally decomposable resin and volatile organic solvent. When used for mounting a die in, say, a cavity in a ceramic (alumina) package, the silver-glass dispersion is dispensed into the cavity in the package, the die is placed on top of the wet paste and the assembly is heated to "burn off" the vehicle, i.e. evaporate the solvent, decompose the resin and drive off the resulting decomposition products. Heating is continued up to a temperature of above 400° C. and this results in sintering of the silver flake. During the sintering process, the glass softens and migrates towards the interfaces with the die and the ceramic package where it wets, and chemically interacts with, the respective surfaces to form a strong chemical bond. The glass does not completely migrate from the sintered silver flake but leaves fingers of glass in the sintered mass of silver, thus providing a mechanical bond between glass and silver.

The heating conditions must be optimised to ensure the correct degree of migration of the glass and sintering of the silver flake and yet avoid damage to the silicon semi-conductor.

Alkali-lead phosphate glasses have been prepared and characterised (see Ray et al, Glass Technology Vol 14 No 2, p 50, 1973). The properties disclosed in that article do not indicate usefulness in any industrial process or product.

We have now found that improved die-attach pastes can be prepared using certain phosphate glasses. The glasses are lead phosphates, preferably not containing an alkali metal such as sodium or potassium and which may be modified by incorporation of one or more oxides of magnesium, calcium, strontium, barium, cadmium, boron, silicon and vanadium. A preferred modifier is vanadium pentoxide. The glass should have a softening temperature in the range 150° to 400° C.

By reason of a low transition temperature and a high mobility during firing, the glass readily wets and reacts with the usual die and support to form a strong chemical bond. The iransition temperature of the glass can, by suitable formulation, be adjusted within a wide range of 150° to 400° C. so that it will meet the requirements of the semi-conductor and of the support to which it is to be attached, and yet will migrate to a satisfactory degree from the sintered silver.

For example, with the presently conventional dies and supports, a phosphate glass of softening temperature about 310° C. can be formulated which will satisfactorily bond the die to the support after heating to no more than 350° C. This temperature is significantly below the industry norm of 400+° C.

By formulating and using phosphate glasses of lower transition temperature, die attach pastes can be made for use with heat-sensitive dies and substrates, i.e. those which cannot withstand temperatures of more than 350° C., and substrates comprising heat-sensitive metallisations, such as nickel or copper, which undergoes oxidation or undesirable diffusion into gold plating. Sintering of the silver at these lower temperatures may be achieved by using it in finer particle size form. Silver flake used in conventional die-attach pastes heated to over 400° C. can be of an average maximum dimension about 20 $\mu$m. In pastes to be heated to around 350° C., a suitable silver flake is of average maximum dimension about 10 $\mu$m.

It may be possible that by formulating and using glasses of even lower softening temperature, e.g. in the range 150° to 200° C., die-attach pastes can be made which would be particularly suitable in situations where elevated temperature excursions (i.e. in excess of 200° C.) are to be avoided. For example, such pastes could be used for attaching dies to a metal heat spreader plate in a plastic support or they could be used in conjunction with Tape Automated Bonding (TAB) technology where high temperatures can cause movement of the polyimide supported connecting leads and consequent circuit failure. The softening temperature of the lead phosphate glasses can be varied by adjusting the lead and alkali metal content and/or by adding oxides of other metals such as boron, calcium, cadmium, magnesium and vanadium.

The thermal properties of the glasses are determined by thermomechanical analysis (TMA) and Differential Scanning Calorimetry (DSC). In TMA, a small cylinder of glass is steadily heated up, the initial expansion and then, when the glass begins to soften, the deformability of the glass being detected by a loaded probe. In DSC, a small sample of the glass is warmed over the temperature range of interest and the changes of thermal energy within the sample are recorded as compared with those of a reference material which is known to be thermally inert. The glass transition temperature is indicated by a small endotherm and recrystallisation (devitrification) by an exotherm.

The glasses used in the die-attach pastes should not be hygroscopic or highly water-soluble. The adverse effect of atmospheric moisture can be reduced by incorporating vanadium pentoxide in the glass. The rate of attack by water can be determined by measuring the loss in weight of a piece of the glass when immersed in boiling water for, say, an hour. Preferably the loss on weight in such circumstances is less than 0.1% per minute.

Because a link in the attachment chain is through fingers of glass, Young's Modulus of the glass comes into consideration, this being determinable in the usual way by testing a fibre glass in a tensometer. The Young's Modulus of the glass can be raised by incorporating an oxide of aluminium, barium, calcium or lithium although in general the use of lithium is limited due to the tendency of this small cation to migrate and effect the electrical characteristics of the glass, in particular the conductivity. It is preferred that the glass itself is of low conductivity.

Another characteristic which can be varied in the die-attach pastes of this invention is the co-efficient of expansion of the glass. This is another factor which can affect the strength of the bond, particularly in the attachment of large dies where it is desirable to match as far as possible the co-efficient of expansion of the glass with those of the die and support in order to avoid stresses in, or even rupture of, the bond in the cooling following the heating cycle. The co-efficient of expansion can be altered for example by incorporating alkali metal oxide in the glass. However, care must be taken not to add so much alkali metal as to make the glass too susceptible to water and to leaching of the alkali metal cations.

The ability of the silver flake component (a ductile material) to absorb stress within the paste during the firing process can also ameliorate problems arising from mismatch of thermal co-efficients of expansion.

In any event, the lower temperatures to which the pastes of this invention need to be heated to attach a die to a support result in less thermal stress in the assembly on cooling. This in itself makes it possible to attach larger dies, e.g. those of 0.64 cm (0.25 in) or more across attached to a frame or package by a die attach paste based on a silver-filled lead phosphate glass. Another advantage of lowering the thermal stress is that this minimises the formation of cracks within the paste around the die. In addition to being cosmetically undesirable, cracking can also weaken the overall bonding strength of a die attach paste.

It is often of advantage to use a glass which devitrifies when heated above its softening temperature. Such devitrification, i.e. crystallisation on heating, reduces the flow of the glass if overheated and can increase &he strength of the bond provided by the paste. Where reworking of a fired paste may be envisaged in order to remove a defective die from say a hybrid circuit or a multi-chip module, devitrification may be deemed undesirable and so a suitable glass may be adjusted during fabrication in order to exclude this particular property.

By suitable adjustment of the glass characteristics described above, it may be possible to attach power devices direct to conductive metals such as aluminium and copper. Such attachment is preferably carried out at lower temperatures, e.g. about 200° C., to avoid softening the aluminium or unduly oxidising the copper so in these applications a glass of appropriately low softening temperature is used in the die-attach paste. The present invention therefore may also provide a power device directly attached to a conductive metal by a die-attach paste based on silver-filled lead phosphate glass of transition temperature less than 250° C.

When using die-attach pastes based on low transition temperature glasses for use in attach processes involving heating below 400° C., dies which do not have backside metallisation should be used since the maximum temperature to which the die is subjected may not be high enough to ensure migration of sufficient silicon trough the metallisation to form the chemical bond with the glass. Alternatively, a prior heat treatment of a metallised die may be carried out to pre-alloy the silicon and backside metallisation. Also, the organic vehicle should be such as to be adequately "burnt off" at the temperatures involved in the attachment process. Suitable decomposable resins include methacrylate polymers. The solvents used to dissolve the resin should have a boiling point lower than the softening point of the phosphate glass.

Pastes based on the phosphate glasses can be formulated in the known manner, i.e. the ratio of glass to silver powders can be in the range 1:1 to 1:9 by weight, preferably in the range 1:7 to 1:8, and the ratio of these solids to the organic medium can be from 3:1 to 6:1, preferably 5:1 to 6:1 by weight, the medium itself being a volatile organic solvent containing dissolved therein from 1 to 10% by weight of a thermally decomposable resin.

The invention is illustrated by way of example as follows.

Eight glasses were made up of the composition, (mole %), shown in the Table which also indicates the transition temperature (Tg ° C.) of the glasses.

| PbO | $P_2O_5$ | $V_2O_5$ | Tg°C. |
|-----|----------|----------|-------|
| 56  | 17       | 27       | 310   |
| 58  | 22       | 20       | 344   |
| 46  | 21       | 33       | 353   |
| 38  | 20       | 42       | 312   |
| 27  | 29       | 44       | 330   |
| 40  | 12       | 48       | 273   |
| 30  | 12       | 58       | 258   |
| 22  | 8        | 70       | 230   |

The glasses were made by carefully heating a mixture of the oxides in a 5% gold/platinum crucible to about 1000° C. then holding at this temperature for about 3 hours under extraction in an air atmosphere. The resulting molten glass was poured onto a copper-backed stainless steel plate or fritted into demineralised water. When cool, the glass was removed then ball milled dry to a fine powder followed by sieving to below 150 μm (100 U.S. Mesh size) The glass powder, silver flake and organic vehicle were well mixed and the resulting material triple roll milled to form a paste with a fineness of grind (FOG) of below 20 μm.

The weight proportion of glass to silver was 12:88. With glasses of transition temperature about 300° C., a silver flake of average maximum dimension about 20 μm can be used. A silver flake of average maximum dimension about 10 μm is, however, preferred. The addition of small proportions o powder (silver or otherwise) or additives such as silver oxides in order to improve the firing and adhesive properties of the paste can also be utilised. The weight proportion of the solids to organic medium was 85:15. The organic vehicle was a 14 wt % solution of polyethyl methacrylate in 2,2,4 trimethyl 1,3 pentanediolmonoisobutyrate.

Samples of the glasses listed above were separately tested for water resistance by boiling a 1-1.5 g piece of the material in water for an hour. In all cases loss of weight was negligible indicating that the glasses were highly water resistant.

Samples of the silver/glass paste incorporating a lead phosphate glass were tested using alumina substrates and 0.64 cm× 0.64 cm (0.25 in×0.25 in) bare back silicon die. The general procedure is outlined as follows. A small quantity (5-10 µl) of paste is applied to the substrate in the form of a small cone using an SMI Digitron Pipettor. The die is then centrally located onto the paste and pressure applied to leave a paste thickness between the die and substrate of between 0.05 mm and 0.18 mm (0.002 in and 0.007 in). The resulting package is then warmed to 76° C. and held at this temperature for at least 1 hour in order to evaporate the organic solvent. The firing schedule is then commenced to remove the remaining organic material and promote sintering of the silver flake and adhesion via the glass matrix of the die to the substrate. The firing schedule entails heating the package at a rate of less than 50° C. per minute (preferably 25°-30° C. per minute) to the peak firing temperature of between 350°-460° C. at which point it is held for a period of between 4-12 minutes. The package is then allowed to cool to room temperature at a rate of less than 50° C. per minute (preferably 25°-30° C. per minute). Pastes were tested using a Blue M high temperature convection oven, a NORSEC infra-red furnace and BTU belt furnace. With all three modes of heating, satisfactory adhesion was usually obtained as measured using a Sebastian Die Attach Tester. The following data illustrates (1) the ability of the silver-glass pastes to provide satisfactory adhesion as determined by U.S. Mil. Std 883C Method 2027, even at temperatures as low as 350° C. and (2) that adhesion is not adversely affected by higher temperature excursions.

The following data further illustrates the ability of the lead phosphate glass containing pastes to provide satisfactory adhesions at temperatures as low as 350° C. using differing furnaces and with varying firing schedules. The 0.64 cm×0.64 cm bare back dies were used.

| Furnace Profile | ADHESION (LBS) | Paste Batch 4 |
|---|---|---|
| NORSEC | | |
| 3 mins >350° C. | Average | 21.9 |
| Peak 360° C. | St D | 4.0 |
| NORSEC | | |
| 12 mins >350° C. | Average | 30.7 |
| Peak 370° C. | St D | 6.4 |
| NORSEC | | |
| 10.6 mins >350° C. | Average | 23.6 |
| Peak 364° C. | St D | 5.4 |
| NOSEC | | |
| 5.3 mins >350° C. | Average | 24.6 |
| Peak 364° C. | St D | 6.8 |
| BTU | | |
| 8.7 mins >350° C. | Average | 28.2 |
| Peak 365° C. | St D | 3.3 |
| BTU | | |
| 8.7 mins >350° C. | Average | 31.6 |
| Peak 365° C. | St D | 6.8 |

| Furnace (Peak Temp) | ADHESION/LBS | | | | | | | |
|---|---|---|---|---|---|---|---|---|
| | Paste Batch 1 | | Paste Batch 2 | | Paste Batch 3 | | Paste Batch 4 | |
| | Average | St D | Average | St D | Average | St D | Average | St D |
| BLUE M (376° C.) | 19.4 | 2.8 | 12.3 | 3.3 | 21.1 | 2.5 | — | — |
| NORSEC (400° C.) | 24.5 | 8.0 | 32.7 | 11.6 | 30.6 | 11.1 | — | — |
| NORSEC (370° C.) | 15.7 | 4.3 | 23.8 | 2.3 | 36.7 | 5.5 | 29.9 | 6.8 |
| NORSEC (400° C.) | 35.8 | 2.3 | 36.3 | 8.8 | 30.5 | 4.1 | 24.2 | 7.4 |
| NORSEC (460° C.) | 41.4 | 7.2 | 42.8 | 8.5 | 62.3 | 12.1 | 41.4 | 12.2 |
| BTU (350° C.) | 6.7 | 1.4 | 9.1 | 1.9 | 8.8 | 2.0 | 11.0 | 0.4 |
| NORSEC (350° C.) | 14.5 | 4.3 | 28.7 | 5.1 | 20.9 | 10.4 | 27.5 | 13.8 |

Failure Mode Within Paste.
*Norsec and Blue M furnace profiles have a drying step included whereas the BTU profile had separate drying in an oven.
*All dies were 0.64 cm x 0.64 cm (0.25 in x 0.25 in) bare.
*2 × mil. spec. for this size die is 18.9 lbs with 100% die off.

The following data illustrates the ability of the lead phosphate containing silver/glass pastes to provide satisfactory adhesions with larger area dies (A) —0.76 cm×0.76 cm (0.300 in×0.300 in) and (B) —1.02 cm×1.02 cm (0.400 in×0.400 in) bare back die.

| | 360° C. Peak Fire. | | Adhesion (lbs) | |
|---|---|---|---|---|
| Die | Substrate | Drying stage | Paste Batch 5 | Paste Batch 4 |
| A | bare alumina | 75° C. 1.5 hrs | Average 28.0 | Average 35.5 |

-continued

| | 360° C. Peak Fire. | | Adhesion (lbs) | |
|---|---|---|---|---|
| Die | Substrate | Drying stage | Paste Batch 5 | Paste Batch 4 |
| B | bare alumina | 75° C. 2.5 hrs | Spread 17.1–41.8<br>Average 34.0<br>Spread 24.8–44.0 | Spread 24.2–42.4<br>Average 44.0<br>Spread 18.2–69.3 |

2 × Mil. Spec for die size A = 20.0 lbs
4 × Mil. Spec for die size A = 40.0 lbs
2 × Mil. Spec for die size B = 21.7 lbs
4 × Mil. Spec for die size B = 43.4 lbs

We claim:

1. In a silver-filled glass bonding paste for the electronics industry, the improvement wherein a lead phosphate glass consisting essentially of lead oxide, phosphorus oxide and at least one further oxide selected from the oxides of magnesium, calcium, strontium, barium, cadmium, boron, silicon and vanadium and wherein said lead phosphate glass has a softening temperature in the range of 150°–400° C. is the glass component of the paste.

2. The paste of claim 1, wherein the further oxide is vanadium pentoxide.

3. The paste of claim 1, wherein the lead phosphate glass is free of alkali metal.

4. The paste of claim 1, wherein the silver comprises silver flakes of average maximum dimension about 10 $\mu$m.

5. The paste of claim 1, wherein the lead phosphate glass consists essentially of 50 to 60 mole % of PbO, 10 to 20 mole % $P_2O_5$ and 20 to 30 mole % $V_2O_5$, the total being 100 mole %.

* * * * *